United States Patent
Kunysz

(10) Patent No.: US 6,445,354 B1
(45) Date of Patent: *Sep. 3, 2002

(54) APERTURE COUPLED SLOT ARRAY ANTENNA

(75) Inventor: Waldemar Kunysz, Calgary (CA)

(73) Assignee: NovAtel, Inc., Calgary (CA)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/375,319

(22) Filed: Aug. 16, 1999

(51) Int. Cl.$^7$ ............................................. H01Q 13/10
(52) U.S. Cl. ...................... 343/770; 343/792.5; 343/895
(58) Field of Search ...................... 343/700 MS, 895, 343/767, 769, 770, 846, 829, 792.5, 853; H10Q 13/10

(56) References Cited

U.S. PATENT DOCUMENTS

| | | | |
|---|---|---|---|
| 3,568,206 A | * 3/1971 | Sisson | 343/750 |
| 3,696,433 A | * 10/1972 | Killion et al. | 343/770 |
| 4,315,266 A | 2/1982 | Ellis, Jr. | 343/895 |
| 4,477,814 A | * 10/1984 | Brumbaugh et al. | 343/725 |
| 4,525,720 A | 6/1985 | Corzine et al. | 343/895 |
| 4,608,572 A | * 8/1986 | Blakney et al. | 343/792.5 |
| 4,658,262 A | 4/1987 | DuHamel | 343/895 |
| 5,220,340 A | 6/1993 | Shafai | 343/895 |
| 5,313,216 A | 5/1994 | Wang et al. | 343/700 MS |
| 5,402,136 A | * 3/1995 | Goto et al. | 343/729 |
| 5,451,973 A | 9/1995 | Walter et al. | 343/895 |
| 5,621,422 A | 4/1997 | Wang | 343/895 |
| 5,646,633 A | 7/1997 | Dahlberg | 343/700 MS |
| 5,712,647 A | 1/1998 | Shively | 343/895 |
| 5,815,122 A | 9/1998 | Nurnberger et al. | 343/767 |
| 5,861,848 A | 1/1999 | Iwasaki | 343/700 |
| 5,936,594 A | 8/1999 | Yu et al. | 343/895 |

OTHER PUBLICATIONS

Nurnberger, M. W. et al., "A New Planar Feed For Slot Spiral Antennas", IEEE Transactions On Antennas and Propagation, vol. 44, No. 1, 1996, pp. 130–131.

* cited by examiner

Primary Examiner—Tho Phan
(74) Attorney, Agent, or Firm—Cesari and McKenna, LLP

(57) ABSTRACT

A planar, phased-array antenna including a nonconductive substantially planar substrate and a transmission line disposed on one surface is disclosed, a segment of the transmission line forming an arc of radius R centered on the antenna axis. A conductive layer on the other antenna surface includes two or more slotted openings, each slotted opening having one end located within a distance R of the antenna axis, such that, when an electromagnetic signal is fed into one end of the transmission line, electromagnetic energy is sequentially coupled into the slotted openings, and a circularly-polarized signal is radiated from the antenna substantially in the direction of the antenna axis. An amplifier or a connector may be electrically connected to one or both ends of the transmission line, or one end of the transmission line may be terminated in an impedance load to form a leaky-wave antenna. The slotted openings may comprise either or both straight and curved segments, and may be of the same or unequal lengths. Curved slotted openings may be oriented clockwise or counter-clockwise to transmit or receive either is left-handed or right-handed polarized signals.

42 Claims, 7 Drawing Sheets

APERTURE COUPLED SLOT ARRAY ANTENNA

BACKGROUND OF THE INVENTION

1. Field of the Invention

The present invention is related to planar broadband antennas and, more particularly, to an antenna for transmitting or receiving circularly-polarized signals.

2. Description of the Prior Art

Antennas producing circularly-polarized signals are known in the art. U.S. Pat. No. 5,861,848, issued to Iwasaki, for example, discloses a circularly polarized wave patch antenna with short circuit portion. The directivity of a patch antenna can be increased by incorporation of a choke ring ground plane, but this increases the weight of the antenna.

U.S. Pat. No. 5,815,122, issued to Nurnberger et al., for example, discloses a slot spiral antenna with a single spiral slot on one side of the antenna, and a spiral microstrip feed line on the reverse side. The reference teaches primarily a single-slot configuration which results in an antenna having a low directivity. Moreover, the placement of an additional component, such as a low-noise amplifier, on the antenna itself is impractical.

While the art describes planar antennas producing circularly-polarized radiation, there remains a need for improvements that offer advantages and capabilities not found in presently available devices, and it is a primary object of this invention to provide such improvements. It is another object of the invention to provide such a planar antenna with an improved directivity.

It is yet another object of the present invention to provide a slot array antenna having a distribution feed line which matches the input/output signals with the spatial angular configuration of the antenna slots.

It is further another object of the present invention to provide such a planar antenna which allows for the mounting of active circuitry on the antenna substrate.

Other objects of the invention will be obvious, in part, and, in part, will become apparent when reading the detailed description to follow.

SUMMARY OF THE INVENTION

A planar antenna includes a nonconductive substantially planar substrate and a transmission line disposed on one surface, a segment of the transmission line forming an arc of radius R centered on the antenna axis. A conductive layer on the other antenna surface includes two or more slotted openings, each slotted opening having one end located within a distance R of the antenna axis, such that, when an electromagnetic signal is fed into one end of the transmission line, electromagnetic energy is sequentially coupled into the slotted openings, and a circularly-polarized signal is radiated from the antenna substantially in the direction of the antenna axis. The electrical phase length of the transmission line is matched to the spatial angular difference between two consecutive slotted openings, so as to provide for a phased-array operation.

An amplifier or a connector may be electrically connected to one or both ends of the transmission line, or one end of the transmission line may be terminated in an impedance load to form a leaky-wave antenna. The slotted openings may comprise either or both straight and curved segments, and may be of the same or unequal lengths. Curved slotted openings may be oriented clockwise or counter-clockwise to transmit or receive either left-handed or right-handed polarized signals.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
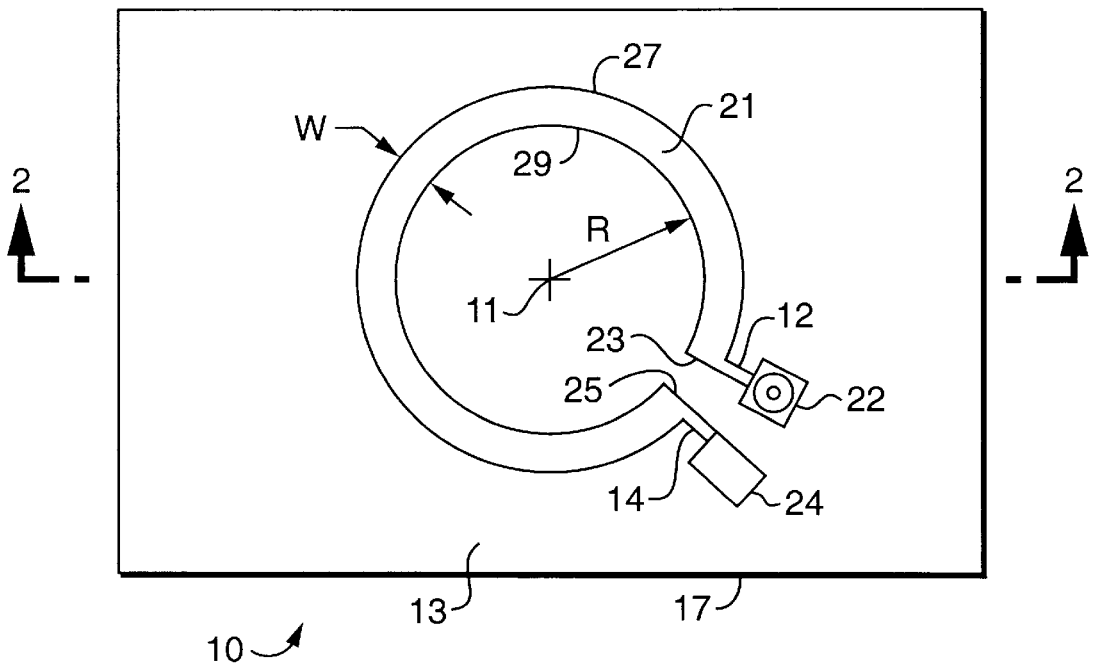
FIG. 1 is a diagrammatical view of the back side of an antenna in accordance with the present invention showing an arc-shaped transmission line disposed about an antenna axis.

FIG. 1 is a diagrammatical view showing the back side of a substantially planar antenna 10 for receiving or transmitting electromagnetic signals of wavelength λ, in accordance with the present invention. A back surface 13 of the antenna 10 is bounded by a peripheral edge 17. The peripheral edge 17 encloses an antenna axis 11 oriented orthogonal to the back surface 13. A transmission line 21, which may be a microstrip, a coplanar waveguide, or other such conductive component as known in the relevant art, is disposed on the back surface 13. The transmission line 21 includes an input end 23 for receiving or outputting the electromagnetic signals. The input end is electrically connected by a first conductive lead 12 to a connector 22, such as an RF connector, for interfacing with external circuitry. A terminal end 25 of the transmission line 21 is electrically connected to a load impedance 24 via a second conductive lead 14. The transmission line 21 is in the shape of a circular arc, where an inside edge 29 of the transmission line 21 lies at a radius of R and an outside edge 27 lies at a radius of R+w from the antenna axis 11. The guided wave length of the transmission line is equal to one or more transmitted (or received) wavelengths λ.

Figure 2:
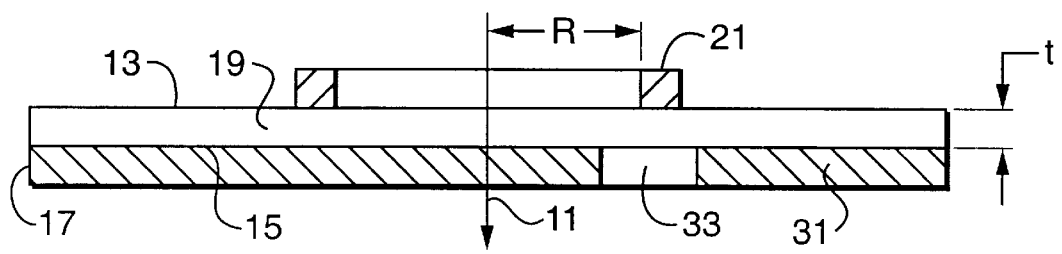
FIG. 2 is a cross-sectional view of the antenna of FIG. 1 showing a conductive plane disposed on the antenna front side.

FIG. 2 is a cross-sectional view of the antenna 10 as indicated by the sectional arrows in FIG. 1. The antenna 10 comprises a substrate 19 of nonconductive or dielectric material having a thickness t, where the transmission line 21 is disposed on the back surface 13 of the substrate 19 and a conductive layer 31 is disposed on a front surface 15 of the substrate 19. The front surface 15 is likewise bounded by the peripheral edge 17.

Figure 3:
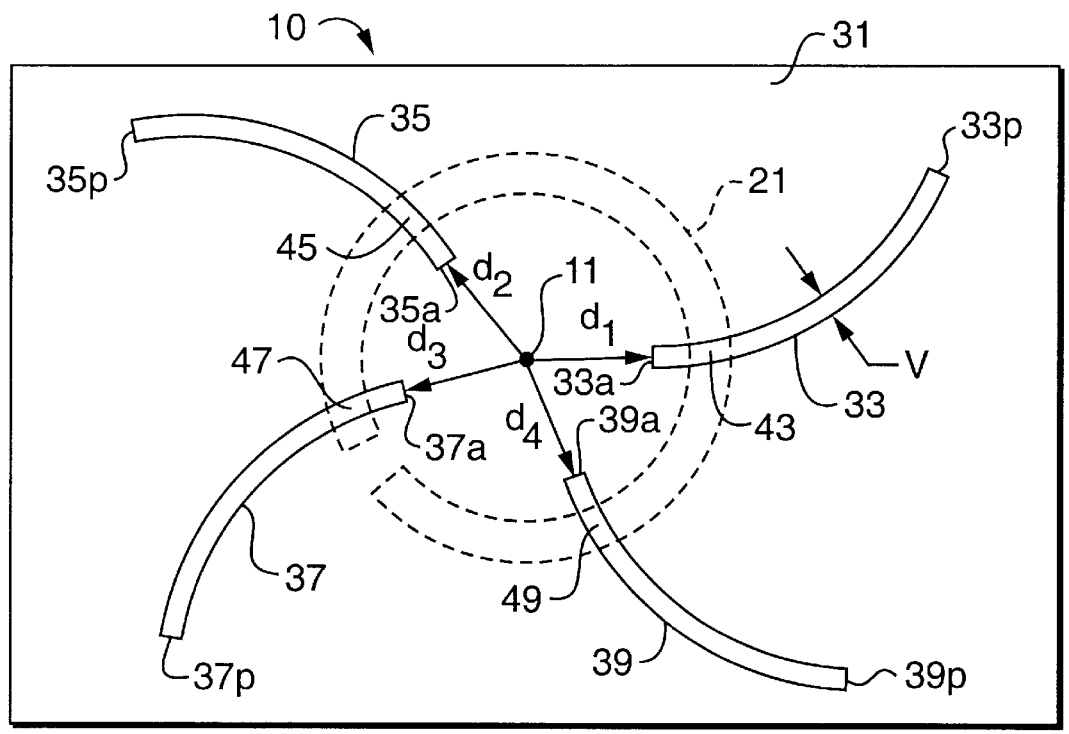
FIG. 3 is a diagrammatical view of the front side of the antenna of FIG. 1 showing an array of slotted openings disposed in the conductive plane.

FIG. 3 is a diagrammatical view of the front side of the antenna 10 showing that the conductive layer 31 includes a plurality of similar curved, slotted openings 33, 35, 37, and 39, where each slotted opening 33, 35, 37, and 39 extends through the conductive layer 31 to the front surface 15 of the substrate 19. The antenna 10 may thus be fabricated from a two-layer printed circuit board (PCB), where the transmission line 21 and the slotted openings 33, 35, 37, and 39 can be formed by suitably etching portions of the respective cladding layers to form the slotted openings 33, 35, 37, and 39 and the transmission line 21. It should be understood that, although four slotted openings are shown for purpose of illustration, the present invention is not limited to this number and may comprise m slotted openings of varying shapes and lengths, where m≧2, as explained in greater detail below.

Moreover, the slotted openings can be curved in shape as shown, or can be straight segments or a combination of both straight and curved segments, as described in greater detail below. The curved shapes can be a conical section (i.e., a circular, elliptical, parabolic, or hyperbolic arc), an Archimedean spiral, a logarithmic spiral, or an exponential spiral. Straight slotted openings are equivalent to dipoles and, as such, a single slotted opening produces a linearly polarized signal. However, an array of straight slotted openings can be used to transmit, or receive, a circularly-polarized signal, as described in greater detail below. Circular polarization can also be produced by using an array of curved slotted openings, where the respective slotted openings are curved in the direction of the desired circular polarization (i.e., a clockwise curvature to receive or transmit left-hand circularly polarized signals). By using curved slotted openings having the equivalent guided wave lengths of straight slotted openings, the physical size of the antenna can be reduced.

The slotted openings 33, 35, 37, and 39 have respective axial ends 33a, 35a, 37a, and 39a proximate the antenna axis 11, and respective peripheral ends 33p, 35p, 37p, and 39p proximate the peripheral edge 17. Axial ends 33a, 35a, 37a, are, respectively, $d_i$, $d_2$, $d_3$, and $d_4$ from the antenna axis 11 where $d_i$<R. That is, the respective axial ends 33a, 35a, 37a, and 39a of the respective slotted opening 33, 35, 37, and 39 lie inside the circle of radius R defined by the transmission line 21 (here shown in phantom) on the opposite side of the substrate 19. Accordingly, when the antenna 10 is used to transmit signals, electromagnetic energy is fed into the transmission line 21 and is electromagnetically coupled to the slotted opening 33, 35, 37, and 39. This coupling occurs at the four respective regions where the slotted openings 33, 35, 37, and 39 which lie on the front surface 15, are located most proximate to and directly opposite the transmission line 21 which lies on the back surface 13 of the planar antenna 10.

For example, a portion of the slotted opening 33 is located a distance equivalent to the substrate thickness t from the transmission line 21 at a coupling region 43. As is well known in the relevant art, the electromagnetic energy passing through transmission line 21 will produce a radiating field across the slotted opening 33 in the coupling region 43. This electromagnetic energy will be similarly coupled into slotted openings 35, 37, and 39 at coupling regions 45, 47, and 49 respectively. The degree of coupling is a function of the thickness t of the substrate 19, the width w of the transmission line 21, the width v of the slotted opening 33, and the dielectric properties of the substrate 19. Conversely, when the antenna 10 is used to receive signals, radiation energy is received at the slotted openings 33, 35, 37, and 39 is coupled into the transmission line 21 at the respective coupling regions 43, 45, 47, and 49.

Figure 4:
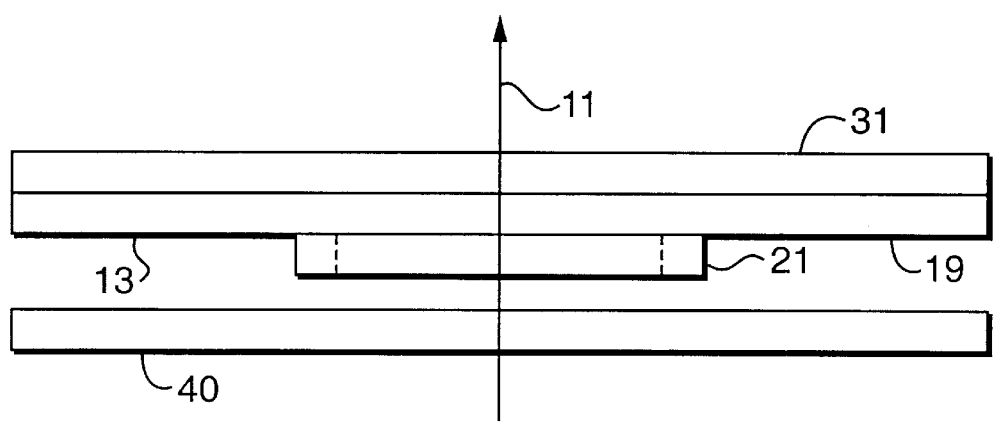
FIG. 4 is an end view of the antenna of FIG. 3 showing the placement of an optional reflector to increase the proportion of electromagnetic energy transmitted in the antenna forward direction.

As can be appreciated by one skilled in the relevant art, electromagnetic energy radiated by the antenna 10 is emitted in both directions along the antenna axis 11. To increase the proportion of energy emitted in the forward direction and reduce the backlobe radiation, a reflector 40 may be emplaced in opposed parallel relationship to the back surface 13 of the antenna 10, as shown in FIG. 4. In an alternative embodiment, an enclosed cavity (not shown) could be used in place of the reflector 40 as is well-known in the relevant art. The radiation pattern emitted from the antenna 10, as well as the radiation pattern roll-off characteristics, can also be varied as desired by increasing or decreasing the separation between the reflector 40 and the antenna 10.

Figure 5:
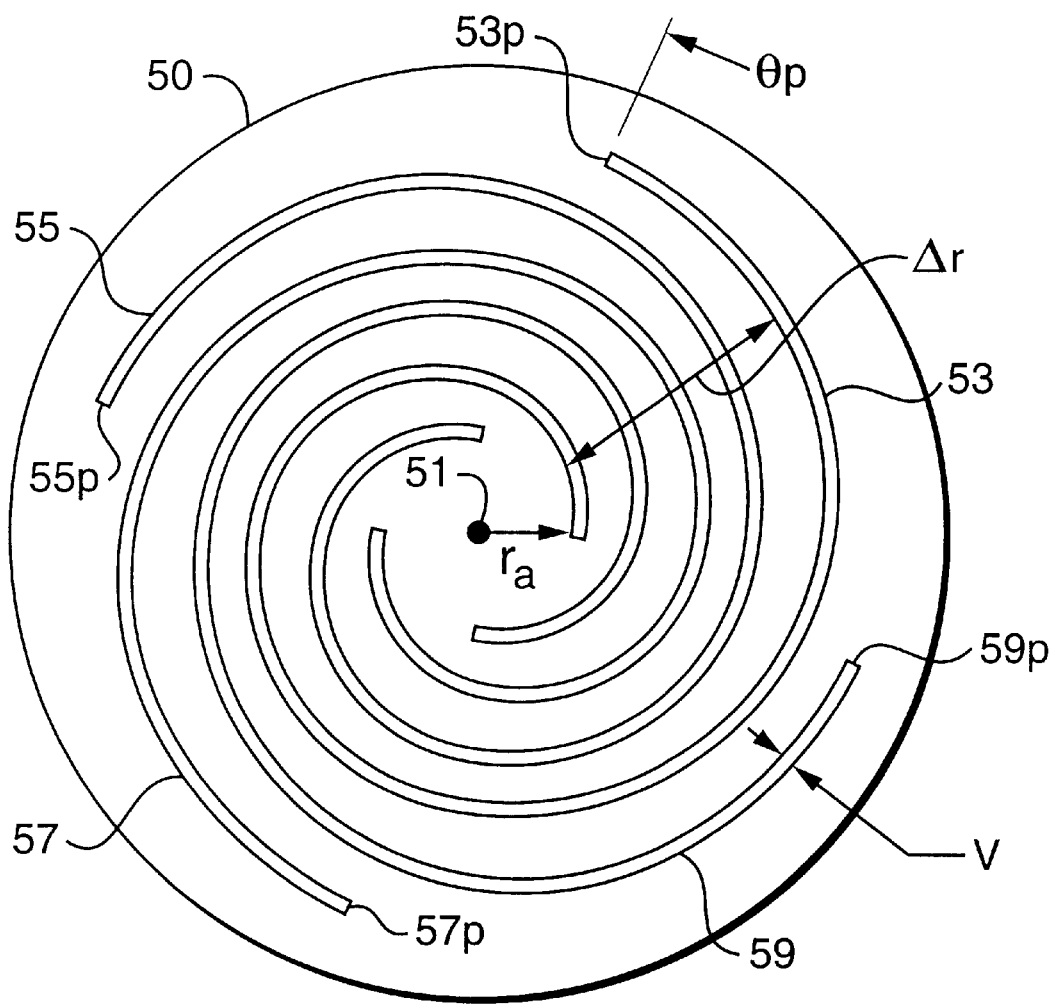
FIG. 5 is a first embodiment of an antenna including four equal-length slotted openings arrayed at 90° intervals about the antenna axis.

FIG. 5 is the front view of a first embodiment of a planar antenna 50 in accordance with the present invention. The planar antenna 50 includes four similar spiral-shaped slotted openings 53, 55, 57, and 59 each of width v and guided wave length $L_{GW}$ symmetrically arrayed about an antenna axis 51 at angular intervals of $$\frac{\pi}{2}$$

radians. This configuration provides for a phased-array slot antenna. Since the slotted openings 53, 55, 57, and 59 curve in the counter-clockwise direction, the transmitted or received signals will be right-hand polarized. Conversely, signals having a left-hand polarization are produced (or received) when the slotted openings 53, 55, 57, and 59 are curved in the clockwise direction. Unwanted cross-polarization is minimized by keeping the opening width v narrow in comparison to the guided wave length $L_{GW}$. The shape of each of the slotted openings 53, 55, 57, and 59 can be described best in polar coordinates using the antenna axis 51 as origin. The radial distances r(θ) of the interior edges of the slotted openings 53, 55, 57, and 59 increase from $r_a$ at the respective axial ends 53a, 55a, 57a, and 59a, to a maximum radius of $r_p$ at the respective peripheral ends 53p, 55p, 57p, and 59p. The radial distance from the antenna axis 51 to the inside edge of any of the slotted opening 53, 55, 57, and 59 increases with the polar angle θ and is also a function of the interval spacing Δr for each spiral-shaped slotted opening where Δr=r(θ+2π)−r(θ). For the slotted opening 53, the radial distance from the antenna axis 51 can be described by means of the equation, $$r_{53}(\theta, \Delta r) = r_a + \Delta r \frac{\theta}{2\pi}. \tag{1}$$

The slotted opening 55 is spatially offset from the slotted opening 53 by $$\frac{\pi}{2}$$

radians (90°). Similarly, the slotted opening 57 is spatially offset by π radians (180°), and the slotted opening 59 is spatially offset by $$\frac{3\pi}{2}$$

(270°). The radial distances r(θ, Δr) of the interior edges of the three slotted openings 55, 57, and 59 can thus be determined by the respective equations, $$r_{55}(\theta, \Delta r) = r_a + \Delta r \frac{\theta - \frac{\pi}{2}}{2\pi}, \theta \geq \frac{\pi}{2} \quad (2$$

$$r_{57}(\theta, \Delta r) = r_a + \Delta r \frac{\theta - \pi}{2\pi}, \theta \geq \pi \quad (3$$

$$r_{59}(\theta, \Delta r) = r_a + \Delta r \frac{\theta - \frac{3\pi}{2}}{2\pi}, \theta \geq \frac{3\pi}{2} \quad (4$$

The guided wave length $L_{GW}$ of each of the slotted openings 53, 55, 57, and 59 is specified to be a multiple of quarter-wavelengths of the receiving or transmitting signal in order to maximize the antenna efficiency $$\left(\text{i.e., } L_{GW} = \frac{n\lambda}{4}\right).$$

In the configuration shown, each spiral-shaped slotted opening subtends an angle of $\theta_p$, where $$\frac{n\lambda}{4} = \int_0^{\theta_p} \left(\frac{\Delta r}{2\pi} \sqrt{1+\theta^2}\right) d\theta \quad (5$$

Figure 6:
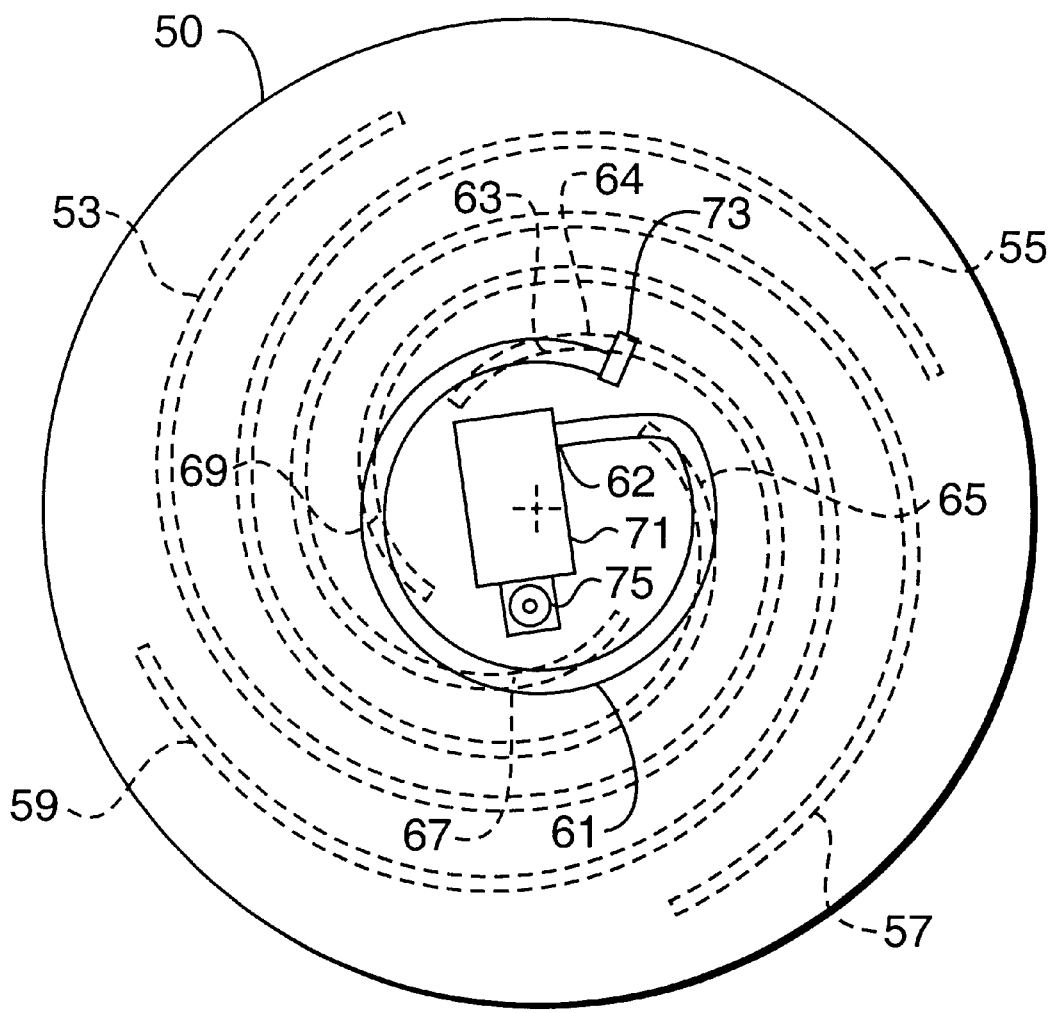
FIG. 6 is a view of the back side of the antenna of FIG. 5 showing an signal amplifier and an impedance load attached to the ends of a transmission line.

The width v of each of the slotted openings 53, 55, 57, and 59 is specified to be substantially smaller than the guided wave length and large enough to enable good electromagnetic coupling between the respective slotted opening 53, 55, 57, and 59 and a transmission line 61, best seen in FIG. 6 which is a rear view of the planar antenna 50. The transmission line 61 "crosses" each of the slotted openings 53, 55, 57, and 59 at respective coupling regions 63, 65, 67, and 69. The coupling regions 63, 65, 67, and 69 are offset by $$\frac{\pi}{2}$$

radians (90°) from one another. This configuration provides for matching the electrical phase differences in the coupling regions 63, 65, 67, and 69 (i.e., differences of 90°) with the spatial differences of the slotted openings 53, 55, 57, and 59 when the guided wave length of the transmission line 61 is tuned to be one wavelength λ. A single, omnidirectional beam is produced when the guided wave length of the transmission line 61 is one wavelength λ, a squinted beam is produced when the guided wave length is less than one wavelength, and multiple directional beams are produced when the guided wave length of the transmission line 61 is more than one wavelength.

A signal is transmitted (or received) by means of a signal source (or receiver) connected to an input/output end 62 of the transmission line 61 via a low-noise amplifier 71. A connector 75 provides for connecting the transmitted (or received) signal to external circuitry via a coaxial cable, an optical fiber, or a waveguide. An impedance load 73 is coupled to a terminal end 64 of the transmission line 61 to provide a leaky-wave antenna configuration and to thus ensure a uniform amplitude coupling to all slotted openings 53, 55, 57, and 59. Alternatively, the connector 75 can be directly attached to the input/output end 62 of the transmission line 61 and the amplifier 71 can be located on a separate circuit board.

For the configuration shown, a transmitted signal originating in the low-noise amplifier 71 and terminating in the impedance load 73 passes through the transmission line 61 in a counter-clockwise direction (as viewed from the front of the planar antenna 50). As the transmitted signal is successively coupled to the slotted openings 53, 55, 57, and 59 at the respective coupling regions 63, 65, 67, and 69, a right-hand polarized signal is emitted from the planar antenna 50. Alternatively, the signal can be transmitted through the transmission line 61 in a clockwise direction and the slotted openings 53, 55, 57, and 59 can be curved in a clockwise direction for a transmitted (or received) signal which is left-hand polarized. For a configuration in which the signal travels in the direction opposite to the direction of the spiral slotted openings, both right-hand and left-hand polarized radiation is transmitted (or received).

Figure 7:
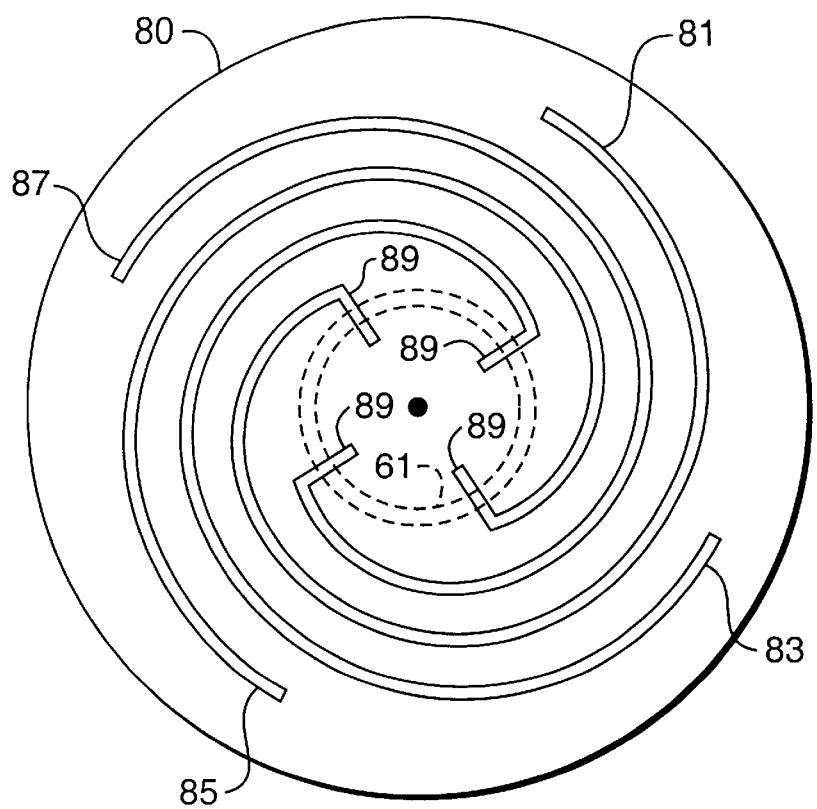
FIG. 7 is a second embodiment of an antenna including curved slotted openings with straight radial slotted segments to increase coupling between the slotted openings and a transmission line.

In a second embodiment, shown in FIG. 7, an antenna 80 comprises an array of four slotted openings 81, 83, 85, and 89 coupled to the transmission line 61 (on the back side of the antenna 80). To improve electromagnetic coupling to the transmission line 61, the slotted openings 81, 83, 85, and 87 each include a straight, radial segment 89 oriented at a right angle to the transmission line 61. The slotted openings 81, 83, 85, and 87 together with the respective radial segments 89 are tuned so as to optimally transmit (or receive) a specified wavelength λ. Because slotted antennas are broadband, the antenna 80 can transmit (or receive) a spectral band of wavelengths, in addition to radiation of wavelength λ. If the spectral band of wavelengths lies within 30% of λ, a slotted opening tuned to a guided wave length λ can also be used for transmitting (or receiving) the spectral band wavelengths. For wavelengths lying outside this spectral band, a second slotted opening of different guided wave length is used.

Figure 8:
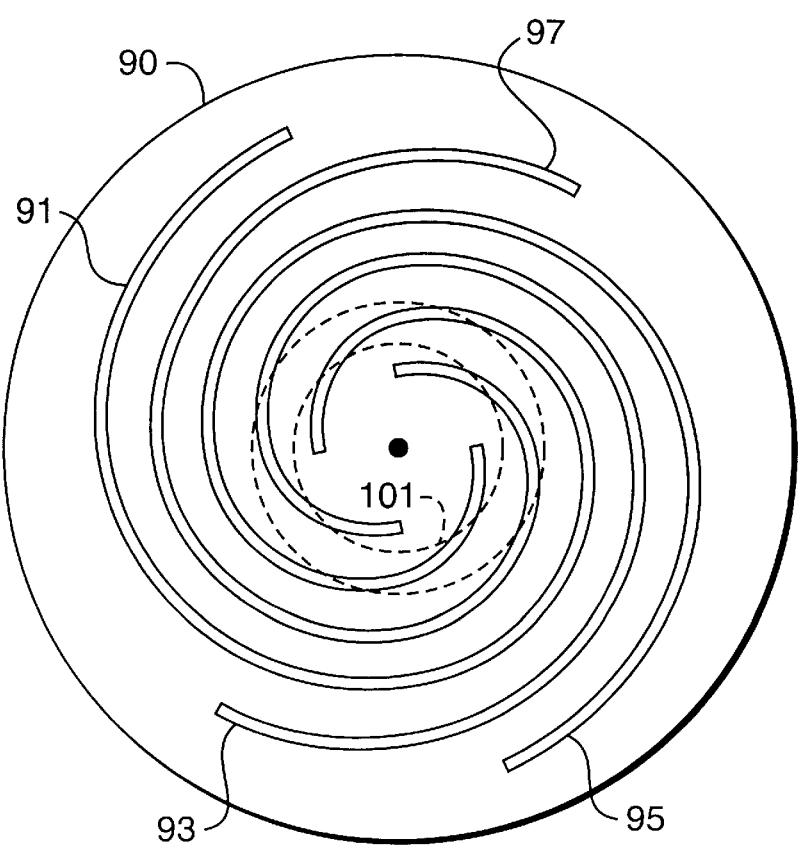
FIG. 8 is a third embodiment of an antenna including clockwise spiral slotted openings of two different lengths for transmitting or receiving left-hand polarized signals of two different wavelengths.

For example, in the third embodiment shown in FIG. 8, an antenna 90 is configured to transmit and receive left-hand polarized signals at two wavelengths, $\lambda_1$ and $\lambda_2$. Two slotted openings 91 and 95 are tuned for the longer wavelength $\lambda_1$, and two slotted openings 93 and 97 are tuned for the shorter wavelength $\lambda_2$. The slotted opening 91 can be tuned to the wavelength $\lambda_1$, by having a guided wave length $L_{GW}$ of: i) one wavelength ($\lambda_1$), ii) two wavelengths ($2\lambda_1$), iii) one-half wavelength $$\left(\frac{\lambda_1}{2}\right),$$

iii) one-quarter wavelength $$\left(\frac{\lambda_1}{4}\right),$$

or iv) some other multiple or fraction of a wavelength $$\left(\frac{a\lambda_1}{b}\right).$$

Figure 9:
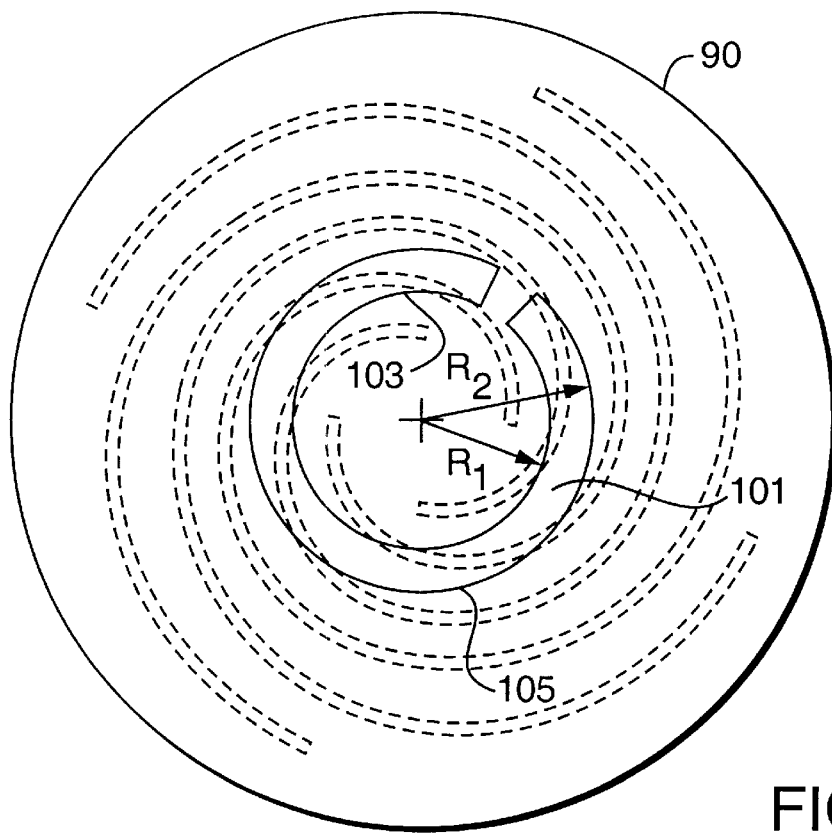
FIG. 9 is a view of the back side of the antenna of FIG. 8 showing a wide transmission line for optimally coupling signals of two different wavelengths.

The antenna 90 comprises a transmission line 101 having a greater width in comparison to the width of transmission line 61 (in FIG. 6). As best seen in FIG. 9, the transmission line 101 has an inside edge 103 of radius of curvature $R_1$ and an outside edge 105 of radius of curvature $R_2=R_1+w$. As well-known in the relevant art, a signal propagating within the transmission line 101 will appear mostly at the edges 103 and 105. The guided wave length along the inside edge 103 is smaller than the guided wave length along the outside edge 105 by the fraction $$\frac{R_1}{R_2}.$$

By selecting suitable values for $R_1$ and $R_2$, the transmission line 101 can be optimized for coupling more than one wavelength into the array of slotted openings 91, 93, 95, and 97.

Figure 10:
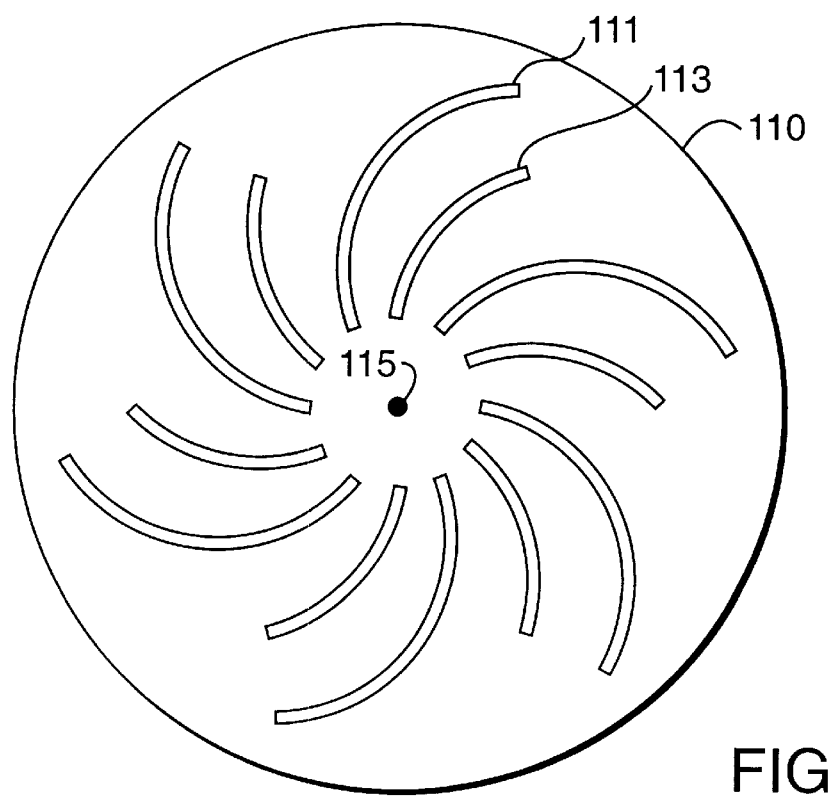
FIG. 10 is a front view of a fourth embodiment of an antenna with high directivity including twelve spiral-shaped slotted openings equally arrayed about the antenna axis.

As stated above, the invention is not limited to a single frequency or to only four slotted openings. In a fourth embodiment, shown in FIG. 10, an antenna 110 comprises six slotted openings 111 tuned to a first wavelength $\lambda_1$ and six slotted openings 113 tuned to a second, shorter wavelength $\lambda_2$. The array of slotted openings 111 are disposed about an antenna axis 115 within the array of slotted openings 113. The six slotted openings 111 are spaced apart from one another at angular intervals of $$\frac{\pi}{3}$$

radians (60°), and the six slotted openings 113 are spaced apart from one another at angular intervals of $$\frac{\pi}{3}$$

radians (60°). All twelve slotted openings 111 and 113 are coupled to a transmission line (not shown) located on the back side of the antenna 110. With twelve slotted openings, the antenna 110 has a higher directivity and a greater pattern roll-off from boresight to antenna horizon than, for example, the antenna 50. in FIG. 5, comprising four slotted openings.

Figure 11:
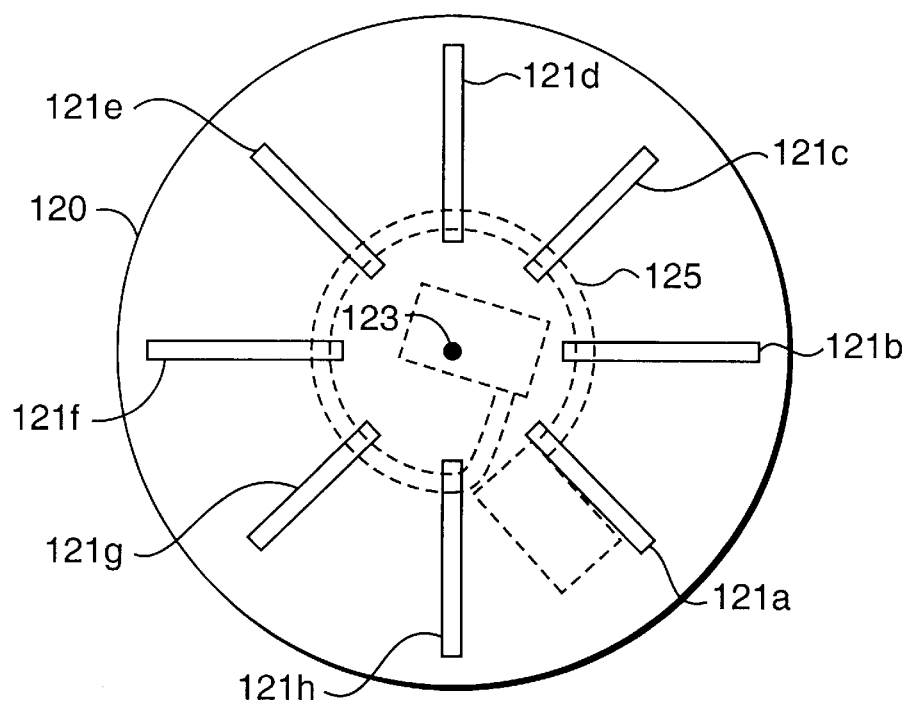
FIG. 11 is a front view of a fifth embodiment of an antenna including an array of straight slotted openings.
Figure 12:
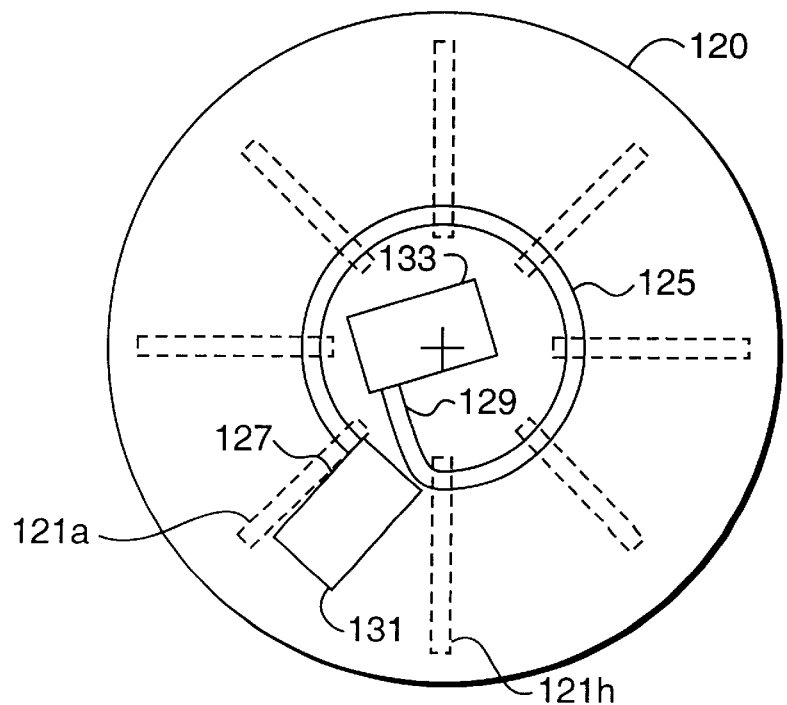
FIG. 12 is a rear view of the antenna of FIG. 11 showing low-noise signal amplifiers attached to the ends of a transmission line.

In a fifth embodiment, shown in FIG. 11, an antenna 120 comprises eight straight slotted openings 121a, 121b, . . . , and 121h arrayed about an antenna axis 123. Each slotted opening 121a–121h is coupled to a transmission line 125 on the back side of the antenna 120, as shown in FIG. 12. A first end 127 of the transmission line 125 is connected to a first signal amplifier 131, and a second end 129 of the transmission line 125 is connected to a second signal amplifier 133. There is also provided a switching circuit (not shown) which enables either the first signal amplifier 131 or the second signal amplifier 133 to transmit a corresponding signal through the transmission line 125. A signal transmitted by the first signal amplifier 131 travels in a counter-clockwise direction, from the first end 127 to the second end 129. The input impedance of the second signal amplifier 133 provides an impedance load to the signal transmitted by the first signal amplifier 131. The counter-clockwise signal is coupled first into the straight slotted opening 121a and last into the straight slotted opening 121h. This coupling sequence produces an emitted signal having left-handed circular polarization.

Similarly, a signal transmitted by the second signal amplifier 133 travels in a clockwise direction, from the second end 129 to the first end 127. The input impedance of the first signal amplifier 131 provides an impedance load to the signal transmitted by the second signal amplifier 133. The clockwise signal is coupled first into the straight slotted opening 121h and last into the straight slotted opening 121a. This coupling sequence produces an emitted signal having right-handed circular polarization. In this way, a single antenna can be used to transmit signals of either polarization. Alternatively, the second signal amplifier 133 can be replaced by a receiver (not shown), and the antenna 120 can be used to transmit left-handed circularly polarized signals via first signal amplifier 121 and to receive right-handed circularly polarized signals via the receiver. If the first signal amplifier is also replaced by a second receiver (not shown), both left-hand polarized and right-hand polarized signals can be received by the antenna 120.

While the invention has been described with reference to particular embodiments, it will be understood that the present invention is by no means limited to the particular constructions and methods herein disclosed and/or shown in the drawings, but also comprises any modifications or equivalents within the scope of the claims.

What is claimed is:

1. An antenna (10), suitable for transmitting and receiving electromagnetic signals of wavelength λ, said antenna comprising:

a nonconductive substantially planar substrate (19) having first (13) and second (15) surfaces bounded by a common peripheral edge (17), said peripheral edge enclosing an antenna axis (11) orthogonal to said first and second surfaces;

a transmission line (21) disposed on said first surface, said transmission line comprising a first end (23), a second end (25), and an inner edge (29) extending between said first and second ends, at least a portion of said inner edge forming an arc of:radius R centered on said antenna axis; and a conductive layer (31) disposed on said second surface, said conductive layer comprising a plurality of m slotted openings (33), each said slotted opening having one end located within a distance R of said antenna axis and having an essentially uniform width that is substantially less than the length, whereby, when an electromagnetic signal is fed into said first end, electromagnetic energy is coupled sequentially into respective said slotted openings such that a radiated signal is transmitted from said slotted openings substantially in the direction of said antenna axis.

2. The antenna of claim 1 wherein said transmission line inner edge has a guided wave length of at least λ.

3. The antenna of claim 1 wherein said transmission line comprises at least one member of the group consisting of a microstrip and a coplanar waveguide.

4. The antenna of claim 1 further comprising a connector electrically attached to one said transmission line end.

5. The antenna of claim 1 further comprising at least one amplifier electrically connected to at least one said transmission line end.

6. The antenna of claim 1 further comprising an impedance load electrically connected to one said transmission line end.

7. The antenna of claim 1 wherein at least a first said slotted opening has a guided wave length of $$\frac{a\lambda}{b}.$$

8. The antenna of claim 7 wherein a second said slotted opening has a guided wave length greater than the guided wave length of said first slotted opening.

9. The antenna of claim 1 wherein said m slotted openings are arrayed about said antenna axis such that at least two adjacent said slotted openings are spatially separated by an angle of $$\frac{2\pi}{m}.$$

10. The antenna of claim 1 wherein at least one said slotted opening comprises a straight slotted portion.

11. The antenna of claim 1 wherein at least one said slotted opening comprises a curved slotted portion.

12. The antenna of claim 11 wherein said curved slotted portion comprises a shape selected from the group consisting of a conical-section arc, a spiral arc, a logarithmic arc, and an exponential arc.

13. The antenna of claim 1 further comprising a reflector disposed in spaced parallel relationship to said first surface.

14. The antenna of claim 1 further comprising an enclosed cavity disposed adjacent said first surface.

15. The antenna of claim 1 wherein a given said slotted opening is sized to couple more strongly to electromagnetic energy directed across the slot than to electromagnetic energy directed along the slot.

16. An antenna, suitable for transmitting and receiving electromagnetic signals of wavelengths $\lambda_1$ and $\lambda_2$, said antenna comprising:

a nonconductive substantially planar substrate having first and second surfaces bounded by a common peripheral edge, said peripheral edge enclosing an antenna axis orthogonal to said surfaces;

a transmission line disposed on said first surface, said transmission line comprising a first end, a second end, and an inner edge extending between said first and second ends, at least a portion of said inner edge forming an arc of radius R centered on said antenna axis; and a conductive layer disposed on said second surface, said conductive layer comprising a first array of m slotted openings, each said first array slotted opening having a peripheral end located proximate said peripheral edge and an axial end located within a distance R of said antenna axis, each said first array slotted opening having a guided wave length of integer multiples $$\frac{\lambda_1}{4},$$

between said peripheral end and said axial end, at least one said first array slotted opening spatially separated from an adjacent said first array slotted opening by an angle of $$\frac{2\pi}{m};$$

said conductive layer further comprising a second array of m slotted openings, each said second array slotted opening having a peripheral end located proximate said peripheral edge and an axial end located within a distance R of said antenna axis, each said second array slotted opening having a guided wave length of integer multiples of $$\frac{\lambda_2}{4}$$

between said peripheral end and said axial end, at least one said second array slotted opening spatially separated from an adjacent said second array slotted opening by an angle of $$\frac{2\pi}{m}$$

whereby, when an electromagnetic signal is fed into said transmission line via said first end, electromagnetic energy is sequentially coupled into respective said slotted openings such that a radiated signal having a wavelength of either or both $\lambda_1$ and $\lambda_2$ is transmitted from said slotted openings substantially in the direction of said antenna axis.

17. The antenna of claim 16 wherein at least one said slotted opening comprises a shape selected from the group consisting of a conical-section arc, a spiral arc, a logarithmic arc, and an exponential arc.

18. The antenna of claim 16 further comprising a connector electrically attached to said transmission line first end.

19. The antenna of claim 16 further comprising at least one amplifier electrically connected to at least one of said first and second transmission line ends.

20. The antenna of claim 16 further comprising an impedance load electrically connected to said transmission line second end.

21. The antenna of claim 16 further comprising a reflector disposed in spaced parallel relationship to said substrate first surface.

22. The antenna of claim 16 further comprising an enclosed cavity disposed adjacent said substrate first surface.

23. A planar antenna suitable for transmitting or receiving an electromagnetic signal, said antenna comprising:

an array of m slotted openings disposed in a top surface of the planar antenna, said slotted openings for receiving or transmitting the electromagnetic signal, said array of slotted openings defining an antenna axis; and a transmission line for sequentially coupling the received or transmitted electromagnetic signal with said slotted openings, said transmission line disposed on a bottom surface of the antenna so as to substantially enclose said antenna axis, said transmission line comprising a plurality of m coupling regions, each said coupling region comprising a segment of said transmission line disposed proximate a corresponding said slotted opening such that an electromagnetic signal transmitted through said transmission line is coupled sequentially into respective said slotted openings surface of the antenna so as to substantially enclose said antenna axis.

24. The antenna of claim 23 wherein at least one said slotted opening comprises a curved slotted portion.

25. The antenna of claim 23 wherein said slotted openings each have a width that is sub-stantially narrower than the length of the slot.

26. The antenna of claim 25 wherein a given said slotted opening is sized to couple more strongly to electromagnetic energy directed across the slot than to electromagnetic energy directed along the slot.

27. A method for emitting a circularly-polarized signal from a planar antenna, said method comprising the steps of:

transmitting a first electromagnetic signal of wavelength $\lambda_1$ along a transmission line disposed on a bottom antenna surface, said transmission line comprising an arc-shaped segment having a radius R centered on an antenna axis; and sequentially coupling said transmitted signal into two or more slotted openings formed within a conductive layer disposed on a top antenna surface, each said slotted opening having an end located within a distance R of the antenna axis, said slotted openings arrayed about the antenna axis such that a signal is emitted having wavelength $\lambda_1$ with one of a right-hand or a left-hand circular polarization.

28. The method of claim 27 wherein said step of sequentially coupling comprises the step of producing a radiation field extending from said transmission line to said slotted openings.

29. The method of claim 27 further comprising the steps of:

transmitting a second electromagnetic signal of wavelength $\lambda_2$ along said transmission line; and sequentially coupling the transmitted signal into said slotted openings such that a signal of wavelength $\lambda_2$ is emitted.

30. The method of claim 27 further comprising the steps of:

transmitting a second electromagnetic signal of wavelength $\lambda_2$ along said transmission line in a direction opposite to that of the direction of transmission of said first electromagnetic signal; and reverse sequentially coupling the transmitted signal into said slotted openings such that a signal is emitted having the other of a right-hand or a left-hand circular polarization.

31. A method for receiving a circularly-polarized radiated signal by means of a planar antenna, said method comprising the steps of:

receiving the radiated signal at two or more slotted openings formed within a conductive layer disposed on a top surface of the antenna, each said slotted opening having a first end located proximate an antenna periphery and a second end located within a distance R of the antenna axis; and sequentially coupling the received signal from each said slotted opening into a transmission line disposed on a bottom surface of the antenna, said transmission line comprising an arc-shaped segment having an edge radius of R centered on the antenna axis.

32. An antenna (10), suitable for transmitting and receiving electromagnetic signals of wavelength $\lambda$, the antenna comprising:

a nonconductive substantially planar substrate (19) having first (13) and second (15) surfaces bounded by a common peripheral edge (17), the peripheral edge enclosing an antenna axis (11) orthogonal to the first and second surfaces;

a transmission line (21) disposed on the first surface, the transmission line comprising a first end (23), a second end (25), and an inner edge (29) extending between the first and second ends, at least a portion of the inner edge forming an arc of radius R centered on the antenna axis, the transmission line being terminated at the second end by electrical connection to a load impedance (24); and a conductive layer (31) disposed on the second surface, the conductive layer comprising a plurality of m slotted openings (33), each the slotted opening having one end located within a distance R of the antenna axis and having a width that is substantially less than the length, whereby, when an electromagnetic signal is fed into the first end of the transmission line, electromagnetic energy is coupled sequentially into the respective slotted openings such that a radiated signal is transmitted from the slotted openings substantially in the direction of the antenna axis.

33. An antenna (10), suitable for transmitting and receiving electromagnetic signals of wavelength $\lambda$, the antenna comprising:

a nonconductive substantially planar substrate (19) having first (13) and second (15) surfaces bounded by a common peripheral edge (17), the peripheral edge enclosing an antenna axis (11) orthogonal to the first and second surfaces;

a transmission line (21) disposed on the first surface, the transmission line comprising a first end (23), a second end (25), and an inner edge (29) extending between the first and second ends, at least a portion of the inner edge forming an arc of radius R centered on the antenna axis; and a conductive layer (31) disposed on the second surface, the conductive layer comprising a plurality of m slotted openings (33), each the slotted opening having one end located within a distance R of the antenna axis, a width that is substantially less than the length, and an electrical length of integer multiples of $$\frac{\lambda}{4},$$

with at least one slotted opening spatially separated from an adjacent slotted opening by an angle of $$\frac{2\pi}{m},$$

whereby, when an electromagnetic signal is fed into the first end of the transmission line, electromagnetic energy is coupled sequentially into the respective slotted openings such that a radiated signal is transmitted from the slotted openings substantially in the direction of the antenna axis.

34. The antenna of claim 33 further including a reflector disposed in spaced parallel relationship to the first surface of the substrate.

35. The antenna of claim 33 further including an enclosed cavity disposed adjacent the first surface of the substrate.

36. The antenna of claim 33 wherein said transmission line inner edge has a guided wave length of at least $\lambda$.

37. The antenna of claim 33 wherein the transmission line comprises at least one member of the group consisting of a microstrip and a coplanar waveguide.

38. The antenna of claim 33 wherein a second of the slotted openings has an electrical length greater than the electrical length of a first of the slotted openings.

39. The antenna of claim 33 wherein at least one of the slotted openings includes a straight portion.

40. The antenna of claim 33 wherein at least one of the slotted openings includes a curved portion.

41. The antenna of claim 40 wherein the curved portion comprises a shape selected from the group consisting of a conical-section arc, a spiral arc, a logarithmic arc, and an exponential arc.

42. The antenna of claim 33 wherein the second end of the transmission line electrically connects to an impedance load.

\* \* \* \* \*